(12) United States Patent
Sato

(10) Patent No.: US 10,868,218 B2
(45) Date of Patent: Dec. 15, 2020

(54) SEMICONDUCTOR LIGHT EMITTING APPARATUS AND ULTRAVIOLET LIGHT EMITTING MODULE

(71) Applicant: ASAHI KASEI KABUSHIKI KAISHA, Tokyo (JP)

(72) Inventor: Kosuke Sato, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 38 days.

(21) Appl. No.: 16/142,292

(22) Filed: Sep. 26, 2018

(65) Prior Publication Data

US 2019/0097089 A1 Mar. 28, 2019

(30) Foreign Application Priority Data

Sep. 27, 2017 (JP) ................................ 2017-186152

(51) Int. Cl.
*H01L 33/00* (2010.01)
*H01L 33/38* (2010.01)
(Continued)

(52) U.S. Cl.
CPC ............ *H01L 33/382* (2013.01); *H01L 33/38* (2013.01); *H01L 33/62* (2013.01); *H01L 33/647* (2013.01); *H01L 33/20* (2013.01); *H01L 33/32* (2013.01)

(58) Field of Classification Search
CPC ....... H01L 33/382; H01L 33/38; H01L 33/62; H01L 33/647
See application file for complete search history.

(56) References Cited

U.S. PATENT DOCUMENTS

| | | |
|---|---|---|
| 6,514,782 B1 | 2/2003 | Wierer, Jr. et al. |
| 6,573,537 B1 | 6/2003 | Steigerwald et al. |
| | (Continued) | |

FOREIGN PATENT DOCUMENTS

| | | |
|---|---|---|
| JP | 2001-237458 A | 8/2001 |
| JP | 2005-136399 A | 5/2005 |
| JP | 2016-181674 A | 10/2016 |

*Primary Examiner* — Mounir S Amer
*Assistant Examiner* — Alexander Belousov
(74) *Attorney, Agent, or Firm* — Morgan, Lewis & Bockius LLP

(57) ABSTRACT

There is provided an apparatus including a semiconductor light emitting device formed on a surface of a substrate including a first electrode and a plurality of second electrodes formed adjacent to the first electrode in planar view, a base including an opposite surface facing the surface of the substrate, wherein a third electrode corresponding to the first electrode in positional relationship and a fourth electrode corresponding to the plurality of second electrodes in positional relationship are formed on the opposite surface, first connecting bodies electrically connecting the first electrode with the third electrode, and a second connecting body electrically connecting the plurality of second electrodes with the fourth electrode. The plurality of second electrodes (100) have a belt-like planer shape and centerlines respectively bisecting widths of the plurality of second electrodes are substantially parallel in planar view. An even number of the first connecting bodies (102) are disposed substantially line symmetrically about each of extended lines of the centerlines respectively bisecting the widths of the plurality of second electrodes in planar view.

20 Claims, 7 Drawing Sheets

(51) Int. Cl.
  *H01L 33/64*   (2010.01)
  *H01L 33/62*   (2010.01)
  H01L 33/20    (2010.01)
  H01L 33/32    (2010.01)

(56) References Cited

U.S. PATENT DOCUMENTS

| | | | | |
|---|---|---|---|---|
| 2005/0110161 A1* | 5/2005 | Naito | ............ | H01L 24/75 |
| | | | | 257/778 |
| 2011/0068359 A1* | 3/2011 | Yahata | ............ | H01L 33/382 |
| | | | | 257/98 |
| 2017/0263817 A1* | 9/2017 | Hirano | ............ | H01L 21/288 |
| 2018/0040770 A1* | 2/2018 | Obata | ............ | H01L 33/06 |
| 2018/0182922 A1* | 6/2018 | Emura | ............ | H01L 33/62 |
| 2019/0198714 A1* | 6/2019 | Sato | ............ | H01L 29/41 |
| 2019/0252577 A1* | 8/2019 | Scholz | ............ | H01L 27/156 |

\* cited by examiner

SEMICONDUCTOR LIGHT EMITTING APPARATUS AND ULTRAVIOLET LIGHT EMITTING MODULE

TECHNICAL FIELD

The present invention relates to a semiconductor light emitting apparatus and an ultraviolet light emitting module including the same.

BACKGROUND ART

Semiconductor light emitting apparatuses are used for various purposes such as lightning, light sources for analytical equipment, light sources for sterilization, and the like, as the emitted light can be controlled to have wavelengths ranging from deep ultraviolet to infrared wavelengths by appropriately formulating the composition of the semiconductor active layer serving as a light emitting layer.

In a common configuration of semiconductor light emitting apparatuses, a semiconductor light emitting device (semiconductor chip) is mounted on a circuit substrate (package substrate) having connecting bodies such as metal balls for the connection with external metal wiring. A semiconductor light emitting apparatus having a flip chip structure, which is an example of such a configuration, has a p-type electrode and an n-type electrode formed on a surface of the semiconductor chip, this surface faces a package substrate, the p-type electrode and the n-type electrode of the semiconductor chip are electrically connected with corresponding electrodes on the package substrate by connecting bodies such as metal balls, and light is emitted from the other surface of the semiconductor chip.

The p-type electrode and the n-type electrode of the semiconductor chip have a function of passing electric current supplied through the substrate and the connecting bodies to the semiconductor chip when voltage is applied from the outside. The connecting bodies such as metal balls also serve to diffuse heat generated in the semiconductor chip to the package substrate.

To improve wall-plug efficiency, nitride semiconductor light emitting devices with a p-type electrode having a planer shape formed by disposing a plurality of belt-like portions in parallel (a belt-like portion is a portion having such a shape that the size along a first direction of the portion is greater than the size along a second direction that is perpendicular to the first direction) have been used. In such a case, the connecting bodies that electrically connect the n-type electrode of the nitride semiconductor light emitting device with the n-type electrode of the circuit substrate are disposed between adjacent belt-like portions of the p-type electrode or on extended lines of the centerlines respectively bisecting the widths of the belt-like portions (see, e.g., PTL 1).

CITATION LIST

Patent Literature

PTL 1: JP 2001-237458 A

SUMMARY OF INVENTION

Technical Problem

It is desired that a semiconductor light emitting apparatus should have an even amount of emitted light all across the light emitting surface. One of the causes that make the amount of emitted light uneven is the unevenness due to partial concentration of electric current flowing between the p-type electrode and the n-type electrode. Further, it is desired to achieve an even heat diffusion (thermal resistance) all across the light emitting surface to curtail a device failure and unevenness in the amount of light that may be caused by temperature variation in the apparatus.

An object of the present invention is to provide a semiconductor light emitting apparatus including semiconductor light emitting device with a plurality of second electrodes (one type of electrodes of the two types of electrodes formed close to each other in planar view) having a belt-like planer shape, or a semiconductor light emitting apparatus including a semiconductor light emitting device with a second electrode having a shape in planar view including belt-like portions, wherein the unevenness in electric current and in heat diffusion is curtailed.

Solution to Problem

To achieve the above-described object, a semiconductor light emitting apparatus according to a first aspect of the present invention includes the following constituent features (a) to (e).

(a) The apparatus includes a semiconductor light emitting device formed on a surface of a substrate. The semiconductor light emitting device includes a first electrode and a plurality of second electrodes formed adjacent to the first electrode in planar view.

(b) The apparatus includes a base including an opposite surface facing the surface of the substrate. A third electrode corresponding to the first electrode in positional relationship and a fourth electrode corresponding to the plurality of second electrodes in positional relationship are formed on the opposite surface.

(c) The apparatus includes first connecting bodies electrically connecting the first electrode with the third electrode. The apparatus includes a second connecting body electrically connecting the plurality of second electrodes with the fourth electrode.

(d) The plurality of second electrodes have a belt-like planer shape. The centerlines respectively bisecting widths of the plurality of second electrodes are substantially parallel in planar view.

(e) An even number of the first connecting bodies are disposed substantially line symmetrically about the extended line of each of the centerlines respectively bisecting the widths of the plurality of second electrodes.

A semiconductor light emitting apparatus according to a second aspect of the present invention includes the above-described constituent features (a) to (c) and the following constituent features (f) and (g).

(f) The plurality of second electrodes have a belt-like planer shape.

(g) At least one of the first connecting bodies is disposed between the extended lines of the centerlines respectively bisecting the widths of an adjacent pair of the second electrodes in planar view.

A semiconductor light emitting apparatus according to a third aspect of the present invention includes the following constituent features (h) to (1).

(h) The apparatus includes a semiconductor light emitting device formed on a surface of a substrate. The semiconductor light emitting device includes a first electrode and a second electrode formed adjacent to the first electrode in planar view.

(i) The apparatus includes a base including an opposite surface facing the surface of the substrate. A third electrode corresponding to the first electrode in positional relationship and a fourth electrode corresponding to the second electrode in positional relationship are formed on the opposite surface.

(j) The apparatus includes first connecting bodies electrically connecting the first electrode with the third electrode. The apparatus includes a second connecting body electrically connecting the second electrode with the fourth electrode.

(k) The second electrode has a shape in planar view including a plurality of belt-like portions having longitudinally central portions and each adjacent pair of the longitudinally central portions is joined by a joint portion. The centerlines respectively bisecting widths of the plurality of belt-like portions are substantially parallel in planar view.

(l) An even number of the first connecting bodies are disposed substantially line symmetrically about each of extended lines of the centerlines respectively bisecting the widths of the plurality of belt-like portions in planar view.

A semiconductor light emitting apparatus according to a fourth aspect of the present invention includes the above-described constituent features (h) to (j) and the following constituent features (m) and (n).

(m) The second electrode has a shape in planar view including a plurality of belt-like portions having longitudinally central portions and each adjacent pair of the longitudinally central portions is joined by a joint portion.

(n) At least one of the first connecting bodies is disposed between the extended lines of the centerlines respectively bisecting the widths of an adjacent pair of the belt-like portions in planar view.

Advantageous Effects of Invention

The semiconductor light emitting apparatus according to the present invention is a semiconductor light emitting apparatus including a semiconductor light emitting device with a plurality of second electrodes (one type of electrodes of the two types of electrodes formed close to each other in planar view) having a belt-like planer shape, or a semiconductor light emitting apparatus including a semiconductor light emitting device with a second electrode having a shape in planar view including belt-like portions, wherein the unevenness in electric current and in heat diffusion is curtailed.

Further, the semiconductor light emitting apparatus according to the present invention allows the plane area of the semiconductor light emitting device to be smaller than that of a semiconductor light emitting apparatus having a first connecting body disposed between an adjacent pair of second electrodes or between an adjacent pair of belt-like portions and that of a semiconductor light emitting apparatus having a first connecting body disposed on the extended line of the centerline bisecting the width of a second electrode or a belt-like portion.

Further, the semiconductor light emitting apparatus according to the present invention allows greater flexibility in design than a semiconductor light emitting apparatus having a first connecting body disposed between an adjacent pair of second electrodes or between an adjacent pair of belt-like portions.

DESCRIPTION OF EMBODIMENTS

[First Aspect]

A semiconductor light emitting device included in the semiconductor light emitting apparatus according to a first aspect of the present invention includes a plurality of second electrodes having a belt-like planer shape and the centerlines respectively bisecting the widths of the plurality of second electrodes are substantially parallel in planar view. Further, the semiconductor light emitting apparatus according to the first aspect has an even number of first connecting bodies disposed substantially line symmetrically about each of extended lines of the centerlines respectively bisecting the widths of the plurality of second electrodes in planar view.

Note that being substantially parallel includes the case of being parallel in a strict sense as well as the case of being recognizable as parallel to a person skilled in the art even though not parallel in a strict sense (approximately parallel). Further, being substantially line symmetrical includes the case of being line symmetrical in a strict sense as well as the case of being recognizable as line symmetrical to a person skilled in the art even though not line symmetrical in a strict sense (approximately line symmetrical).

Figure 1A:
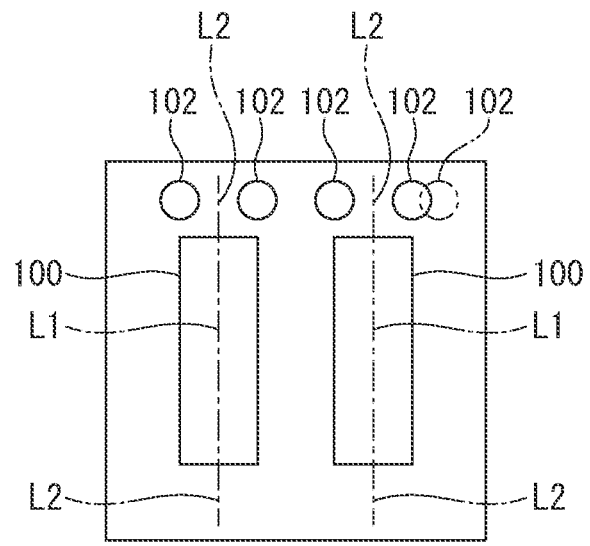
FIG. 1A is a diagram for illustrating an example included in a first aspect of the present invention.

In the example illustrated in FIG. 1A, a semiconductor light emitting device has two second electrodes 100 (a plurality of second electrodes) having a belt-like planer shape. The centerlines L1 respectively bisecting the widths of the second electrodes 100 are parallel. Two (an even number) first connecting bodies 102 are disposed line symmetrically about each of extended lines L2 of the centerlines L1 respectively bisecting the widths of the two second electrodes 100 on one side longitudinally outward of the second electrodes 100.

In this example, the unevenness in electric current and in heat diffusion is curtailed, compared with the case in which two first connecting bodies 102 are disposed line asymmetrically about the extended line L2 of at least one of the two second electrodes 100 on one side longitudinally outward of the second electrodes 100 (for example, the case in which the right one of the first connecting bodies 102 near the right one of the second electrodes 100 is disposed as indicated by the long dashed double-short dashed line).

Note that a semiconductor light emitting apparatus in a flip chip structure has a risk of short circuit or leakage that may be caused by a difference between the distance between the second electrodes 100 and the fourth electrode formed on the substrate and the distance between the first electrode and the third electrode formed on the substrate, but the risk is reduced in the present example compared with the above-described case.

Further, since the first connecting bodies 102 are disposed line symmetrically about the extended lines L2 of the centerlines L1 respectively bisecting the widths of the second electrodes 100, the distance between the second electrodes 100 adjacent to each other can be reduced compared with the case in which the first connecting bodies 102 are disposed line symmetrically about the centerlines L1 respectively bisecting the widths of the second electrodes 100. In other words, when the first connecting bodies 102 are disposed line symmetrically about the centerlines L1 respectively bisecting the widths of the second electrodes 100, the distance between the second electrodes 100 adjacent to each other needs to be greater than the size of the first connecting bodies 102 while, when the first connecting bodies 102 are disposed line symmetrically about the extended lines L2, the distance between the second electrodes 100 adjacent to each other may be equal to or smaller than the seize of the first connecting bodies 102.

As described above, in this example, the device size (the plane area of the semiconductor light emitting device) can be reduced by reducing the distance between the second electrodes 100 adjacent to each other. With a smaller device size, a greater number of semiconductor light emitting devices can be produced from a wafer, which leads to an increased productivity.

Figure 1B:
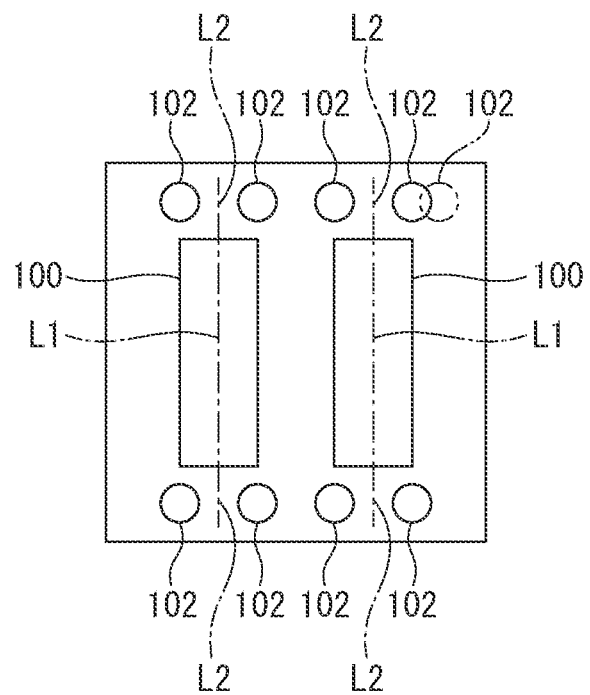
FIG. 1B is a diagram for illustrating an example included in the first aspect of the present invention.

In the example illustrated in FIG. 1B, a semiconductor light emitting device has two second electrodes 100 (a plurality of second electrodes). A pair of first connecting bodies 102 is disposed line symmetrically about each of the extended lines L2 of the centerlines L1 respectively bisecting the widths of the second electrodes 100 on one side longitudinally outward of the second electrodes 100 and on the other side longitudinally outward of the second electrodes 100.

In this example, the unevenness in electric current and in heat diffusion is curtailed compared with the case in which a pair of first connecting body 102 is disposed line asymmetrically about the extended line L2 on at least one of the one side and the other side longitudinally outward of the second electrodes 100 (for example, the case in which the right one of the first connecting bodies 102 near the right one of the second electrodes 100 on the one side longitudinally outward of the second electrodes 100 is disposed as indicated by the long dashed double-short dashed line).

Further, in this example, the distance between the second electrodes 100 adjacent to each other can be reduced and the number of the second electrodes 100 can be reduced, compared with the case in which the same number of first connecting bodies 102 are disposed only on one side longitudinally outward of the second electrodes 100. This allows the device size to be reduced.

[Second Aspect]

A semiconductor light emitting device included in the semiconductor light emitting apparatus according to a second aspect of the present invention includes a plurality of second electrodes having a belt-like planer shape. The semiconductor light emitting apparatus according to the second aspect includes a first connecting body disposed between the extended lines of the centerlines respectively bisecting the widths of an adjacent pair of the second electrodes in planar view.

Note that it is preferable that the semiconductor light emitting device included in the semiconductor light emitting apparatus according to the first aspect and the second aspect includes three or more second electrodes having a belt-like planer shape. A semiconductor light emitting device including three or more second electrodes having a belt-like planer shape provides more places in which to dispose first connecting bodies to be disposed between the extended lines of the centerlines respectively bisecting the widths of an adjacent pair of the second electrodes, which allows more freedom in selecting the places in which to dispose first connecting bodies and the number of first connecting bodies. The resistance to rotational impact can accordingly be increased.

Figure 2A:
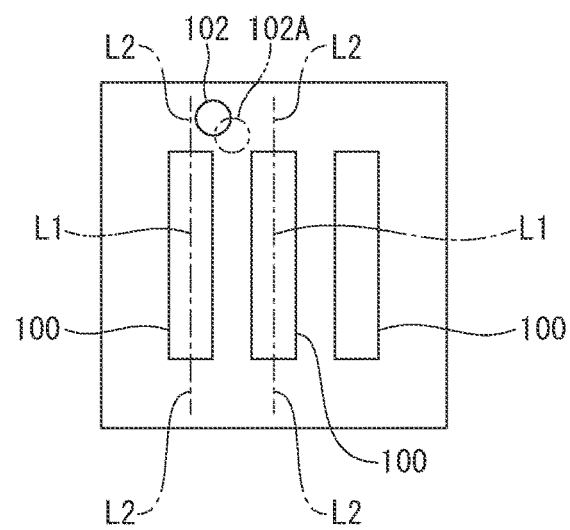
FIG. 2A is a diagram for illustrating an example included in a second aspect of the present invention.

In the example illustrated in FIG. 2A, a semiconductor light emitting device has three second electrodes 100 and has a first connecting body 102 disposed between the extended lines L2 of the centerlines L1 respectively bisecting the widths of an adjacent pair of the second electrodes 100. In this example, the unevenness in electric current and in heat diffusion is curtailed compared with the case in which all first connecting bodies 102 are formed in other positions than the ones between the extended lines L2 of an adjacent pair of the second electrodes 100.

Further, the disposition of the first connecting body 102 between the extended lines L2 allows the device size to be reduced by disposing the first connecting body 102 more adjacent to the second electrodes 100 compared with the case in which the first connecting body 102 is disposed on an extended line L2. For example, the first connecting body 102A illustrated in FIG. 2A is disposed on the center between the extended lines L2 adjacent to each other and more closely to the second electrodes 100 than the first connecting body 102 is. Such a disposition as illustrated by the first connecting body 102A allows the device size to be reduced further.

[Third Aspect]

A semiconductor light emitting device included in a semiconductor light emitting apparatus according to a third aspect of the present invention includes a second electrode having a shape in planar view including a plurality of belt-like portions having longitudinally central portions and each adjacent pair of the longitudinally central portions is joined by a joint portion. The centerlines respectively bisecting the widths of the plurality of belt-like portions are substantially parallel in planar view. Further, in the semiconductor light emitting apparatus according to the third aspect, an even number of first connecting bodies are disposed substantially line symmetrically about each of extended lines of the centerlines respectively bisecting the widths of the plurality of belt-like portions in planar view.

Figure 2B:
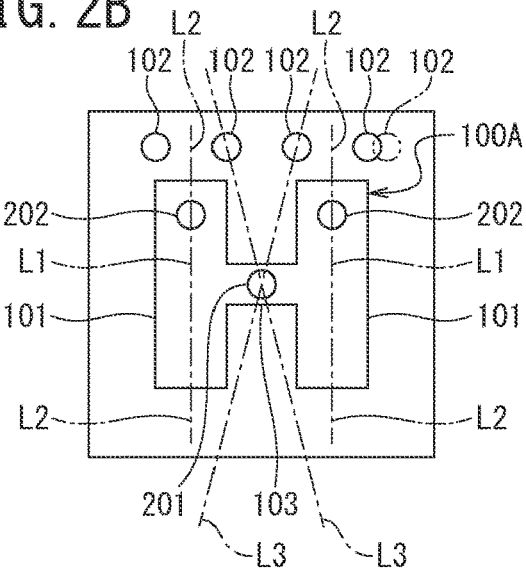
FIG. 2B is a diagram for illustrating an example included in a third aspect of the present invention.

In the example illustrated in FIG. 2B, the second electrode 100A has two belt-like portions 101 and a joint portion 103 joining the longitudinally central portions of the belt-like portions 101 adjacent to each other. The centerlines L1 respectively bisecting the widths of the two belt-like portions 101 are parallel. Two (an even number) first connecting bodies 102 are disposed line symmetrically about each of the extended lines L2 of the centerlines L1 respectively bisecting the widths of the two belt-like portions 101 on one side longitudinally outward of the belt-like portions 101. Further, the semiconductor light emitting device includes second connecting bodies in the form of a connecting body 201 disposed on the joint portion 103 and connecting bodies 202 disposed on an longitudinal end portion of respective belt-like portions 101 joined by the joint portion 103.

In this example, the unevenness in electric current and in heat diffusion is curtailed compared with the case in which two first connecting bodies 102 are disposed line asymmetrically about the extended line L2 of at least one of the two belt-like portions 101 on one side longitudinally outward of the belt-like portions 101 (for example, the case in which the right one of the first connecting bodies 102 near the right one of the belt-like portions 101 is disposed as indicated by the long dashed double-short dashed line).

Further, in this example, as the second electrode 100A has a shape in which the belt-like portions 101 are connected by the joint portion 103, the unevenness in electric current and in heat diffusion is curtailed compared with the case in which a plurality of second electrodes 100 consisting only of belt-like portions 101 are disposed (FIG. 1A). Further, compared with the case in which the connecting body 201 on the joint portion and the connecting bodies 202 at end portions are not provided, the second connecting bodies improve the stability of connection and thereby the semiconductor light emitting device is prevented from separating from the base due to an external impact.

Note that there is a lower limit in the total number of the first connecting bodies and the second connecting bodies for the reduction of thermal resistance, hence the number of the first connecting bodies can be reduced when the number of the second connecting bodies are increased by disposing the connecting body 201 on the joint portion, and the device size can be reduced to the extent of the area corresponding to the reduced number of the first connecting bodies. In other words, the device size can be reduced by providing the connecting body 201 on the joint portion. With a smaller device size, a greater number of semiconductor light emitting devices can be produced from a wafer, which leads to an increased productivity.

Further, in this example, heat generated in the semiconductor light emitting device can be effectively diffused to the substrate through the connecting bodies 202 disposed on an end portion of respective belt-like portions 101.

Figure 2C:
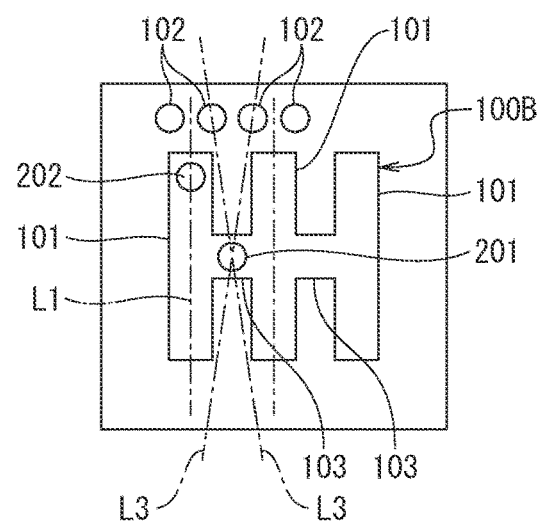
FIG. 2C is a diagram for illustrating an example included in the third aspect of the present invention.

In the example illustrated in FIG. 2C, a second electrode 100B has three belt-like portions 101 and joint portions 103 joining the longitudinally central portions of the adjacent pairs of the belt-like portions 101. The centerlines L1 respectively bisecting the widths of the belt-like portions 101 are parallel. Two (an even number) first connecting bodies 102 are disposed line symmetrically about each of the extended lines L2 of the centerlines L1 respectively bisecting the widths of the three belt-like portions 101 on one side longitudinally outward of the belt-like portions 101. Further, the semiconductor light emitting device includes second connecting bodies in the form of a connecting body 201 disposed on a joint portion 103 and a connecting body 202 disposed on a longitudinal end portion of a belt-like portion 101 joined by the joint portion 103.

In this example, the unevenness in electric current and in heat diffusion is curtailed compared with the case in which two first connecting bodies 102 are disposed line asymmetrically about an extended line L2 of at least one of the three belt-like portions 101 on one side longitudinally outward of the belt-like portions 101.

Further, in this example, as the second electrode 100B has a shape in which the belt-like portions 101 are connected by the joint portions 103, the unevenness in electric current and in heat diffusion is curtailed compared with the case in which a plurality of second electrodes 100 consisting only of belt-like portions 101 are disposed (FIG. 2A). Further, the second connecting bodies improve the stability of connection compared with the case in which the connecting body 201 on the joint portion and the connecting body 202 on an end portion are not provided.

Further, in this example, the device size can be reduced by providing the connecting body 201 on the joint portion, similarly to the example illustrated in FIG. 2B. With a smaller device size, a greater number of semiconductor light emitting devices can be produced from a wafer, which leads to an increased productivity.

Further, in this example, heat generated in the semiconductor light emitting device can be effectively diffused to the substrate through the connecting body 202 disposed on an end portion of a belt-like portion 101.

[Fourth Aspect]

A semiconductor light emitting device included in a semiconductor light emitting apparatus according to a fourth aspect of the present invention includes a second electrode having a shape in planar view including a plurality of belt-like portions having longitudinally central portions and each adjacent pair of the longitudinally central portions is joined by a joint portion. Further, in the semiconductor light emitting apparatus according to the fourth aspect, a first connecting body is disposed between the extended lines of centerlines respectively bisecting widths of an adjacent pair of the belt-like portions in planar view.

Note that it is preferable that the semiconductor light emitting device included in the semiconductor light emitting apparatus according to the third aspect and the fourth aspect includes three or more belt-like portions having a belt-like planer shape. A semiconductor light emitting device including three or more belt-like portions provides more places in which to dispose first connecting bodies to be disposed between the extended lines of the centerlines respectively bisecting the widths of an adjacent pair of the belt-like portions, which allows more freedom in selecting the places in which to dispose first connecting bodies and the number of first connecting bodies. The resistance to rotational impact can accordingly be increased.

Figure 2D:
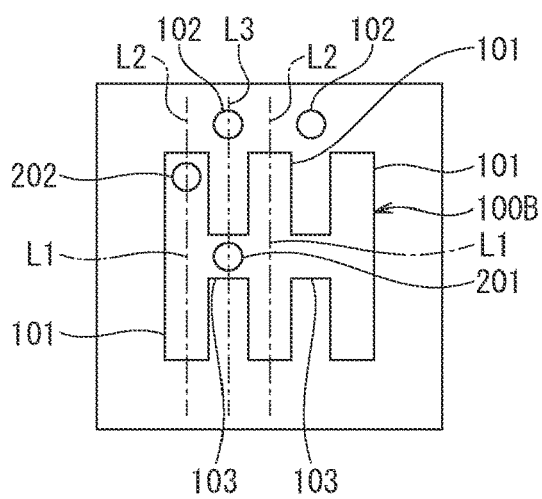
FIG. 2D is a diagram for illustrating an example included in a fourth aspect of the present invention.

In the example illustrated in FIG. 2D, the first connecting bodies 102 are disposed differently from the example illustrated in FIG. 2C. Each of the first connecting bodies 102 are disposed between the extended lines L2 of the centerlines L1 respectively bisecting the widths of an adjacent pair of the belt-like portions 101 of the second electrode 100B. This curtails the unevenness in electric current and in heat diffusion compared with the case in which all first connecting bodies 102 are formed in other positions than the ones between the extended lines L2 of an adjacent pairs of the belt-like portions 101.

Further, in the example illustrated in FIG. 2D, unlike the example illustrated in FIG. 2C, the straight line L3 connecting the center of the connecting body 201 on the joint portion with the center of the first connecting body 102 disposed most closely to the connecting body 201 on the joint portion is substantially parallel to the centerlines L1 respectively bisecting the widths of the belt-like portions 101. In this example, the unevenness in electric current and in heat diffusion is curtailed compared with the case in FIG. 2C, in which the straight lines L3 are not substantially parallel to the centerlines L1 respectively bisecting the widths of the belt-like portions 101.

Further, since the distance between the belt-like portions 101 adjacent to each other can be reduced, the device size can be reduced compared with the example in FIG. 2C. With a smaller device size, a greater number of semiconductor light emitting devices can be produced from a wafer, which leads to an increased productivity.

Figure 2E:
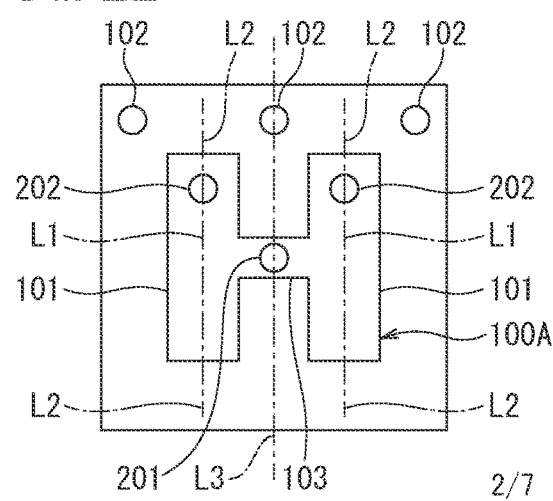
FIG. 2E is a diagram for illustrating an example included in the fourth aspect of the present invention.

In the example illustrated in FIG. 2E, the first connecting bodies 102 are disposed differently from the example illustrated in FIG. 2B. A first connecting body 102 is disposed between the extended lines L2 of the centerlines L1 respectively bisecting the widths of the adjacent pair of the belt-like portions 101 of the second electrode 100B. This curtails the unevenness in electric current and in heat diffusion compared with the case in which all first connecting bodies 102 are formed in other positions than the ones between the extended lines L2 of an adjacent pair of the belt-like portions 101.

Further, in the example illustrated in FIG. 2E, unlike the example illustrated in FIG. 2B, the straight line L3 connecting the center of the connecting body 201 on the joint portion with the center of the first connecting body 102 disposed most closely to the connecting body 201 on the joint portion is substantially parallel to the centerlines L1 respectively bisecting the widths of the belt-like portions 101. In this example, the unevenness in electric current and in heat diffusion is curtailed compared with the case in FIG. 2B, in which the straight lines L3 are not substantially parallel to the centerlines L1 respectively bisecting the widths of the belt-like portions 101.

Embodiments

Embodiments of the present invention will be described in the following but the present invention is not limited to the following embodiments. Although the embodiments described in the following include technically preferable limitations for working the invention, the limitations are not necessary conditions of the invention.

<Structure>

Figure 3:
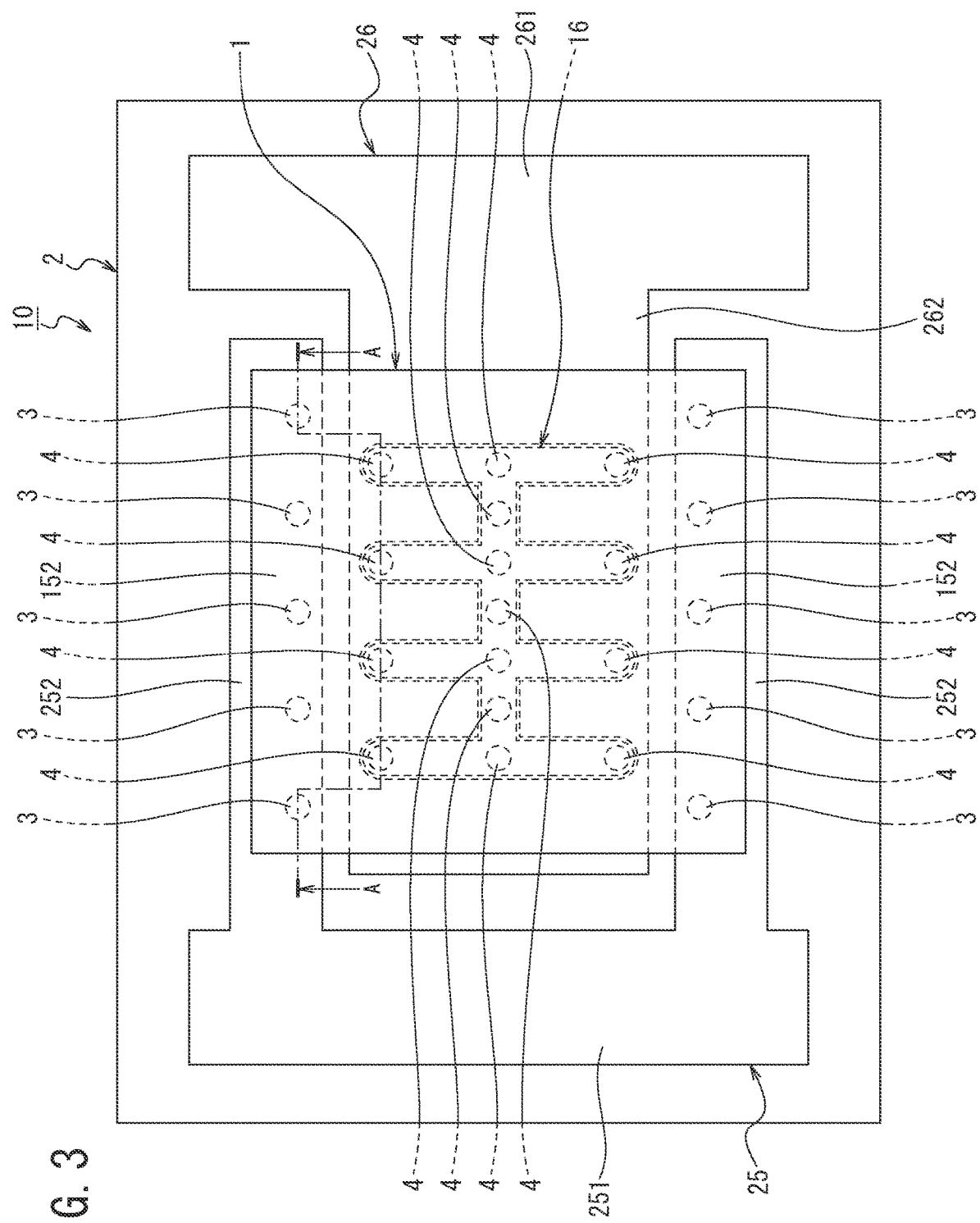
FIG. 3 is a planar view illustrating a semiconductor light emitting apparatus according to an embodiment.

As illustrated in FIG. 3, a semiconductor light emitting apparatus 10 according to an embodiment includes a semiconductor chip (semiconductor light emitting device) 1, a package substrate (base) 2, first metal bumps (first connecting bodies) 3, and second metal bumps (second connecting bodies) 4.

Figure 4:
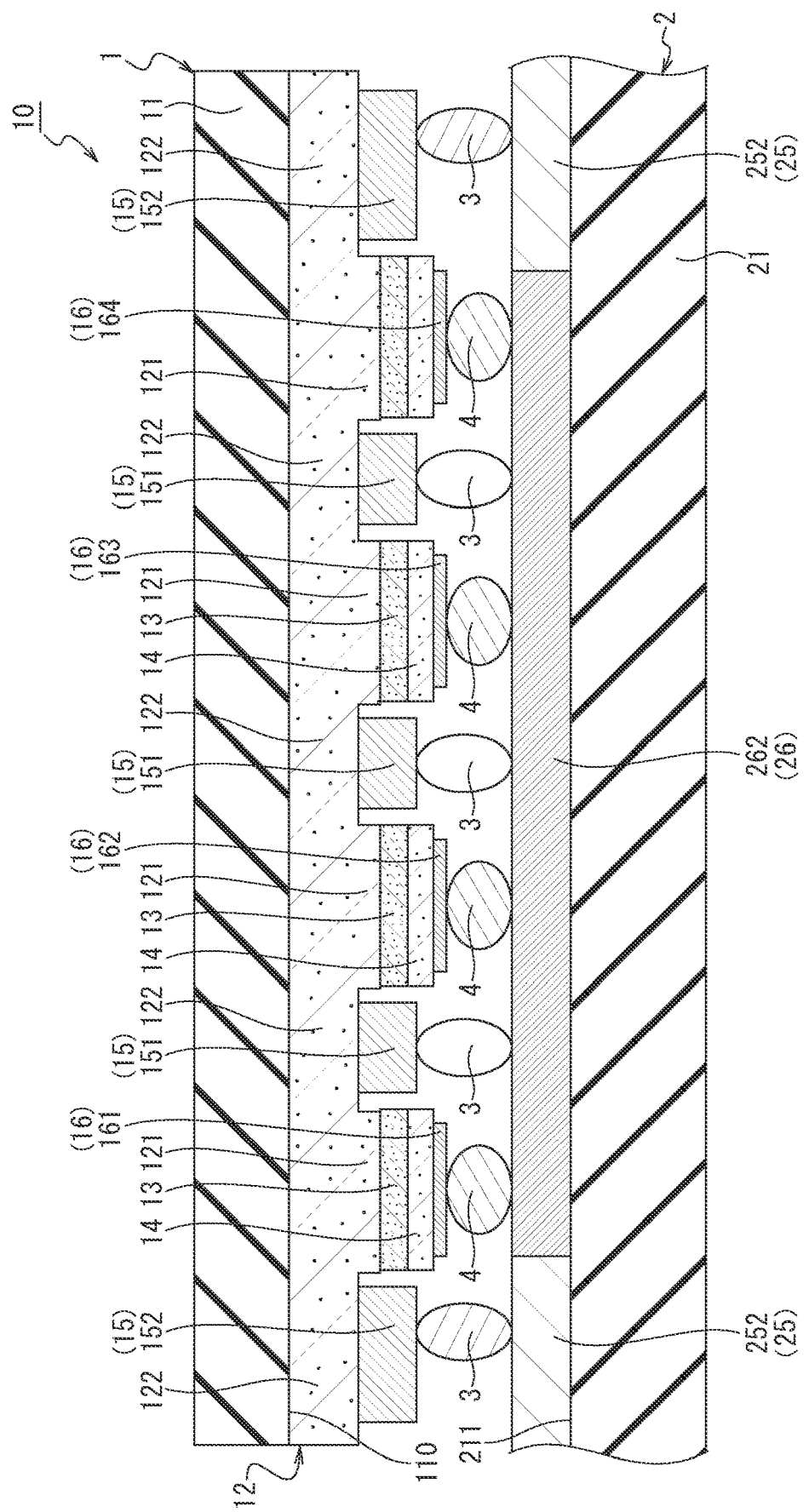
FIG. 4 is a partial cross sectional view along line A-A of FIG. 3.

As illustrated in FIG. 4, the semiconductor chip 1 is a semiconductor light emitting device formed on a surface 110 of a substrate 11 and includes a substrate 11, an n-type nitride semiconductor layer 12, a nitride semiconductor active layer 13, a p-type nitride semiconductor layer 14, an n-type electrode (first electrode) 15, and a p-type electrode (second electrode) 16. In other words, the semiconductor chip 1 is a nitride semiconductor light emitting diode.

The n-type nitride semiconductor layer 12 is formed on the surface 110 of the substrate 11. The n-type nitride semiconductor layer 12 has thick portions 121 and the other portions, which are thin portions 122. The nitride semiconductor active layer 13 is formed on the thick portions 121 of the n-type nitride semiconductor layer 12. The p-type nitride semiconductor layer 14 is formed on the nitride semiconductor active layer 13. The n-type electrode 15 is formed on the thin portions 122 of the n-type nitride semiconductor layer 12. The p-type electrode 16 is formed on the p-type nitride semiconductor layer 14. Note that the semiconductor chip 1 includes an insulation layer insulating the thick portion 121 of the n-type nitride semiconductor layer 12, the nitride semiconductor active layer 13, the p-type nitride semiconductor layer 14, and the p-type electrode 16 from the n-type electrode 15 but the insulation layer is not illustrated in FIG. 4.

The semiconductor chip 1 is a light emitting device and, for example, a device configured to emit ultraviolet lights having a peak wavelength in the range not less than 200 nm and not more than 360 nm. The substrate 11 is, for example, an AlN (aluminum nitride) substrate, a GaN (gallium nitride) substrate, or a sapphire substrate. It is preferable to use an AlN substrate, which has a high heat conductivity, for the substrate 11. The n-type nitride semiconductor layer 12 is, for example, an n-AlGaN layer, or an n-GaN layer. The nitride semiconductor active layer 13 is, for example, a layer having a multiple quantum-well structure (MQW) including quantum well layers including AlGaN and electronic barrier layers including AlGaN. The p-type nitride semiconductor layer 34 is, for example, a p-AlGaN layer or a p-GaN layer.

Figure 5:
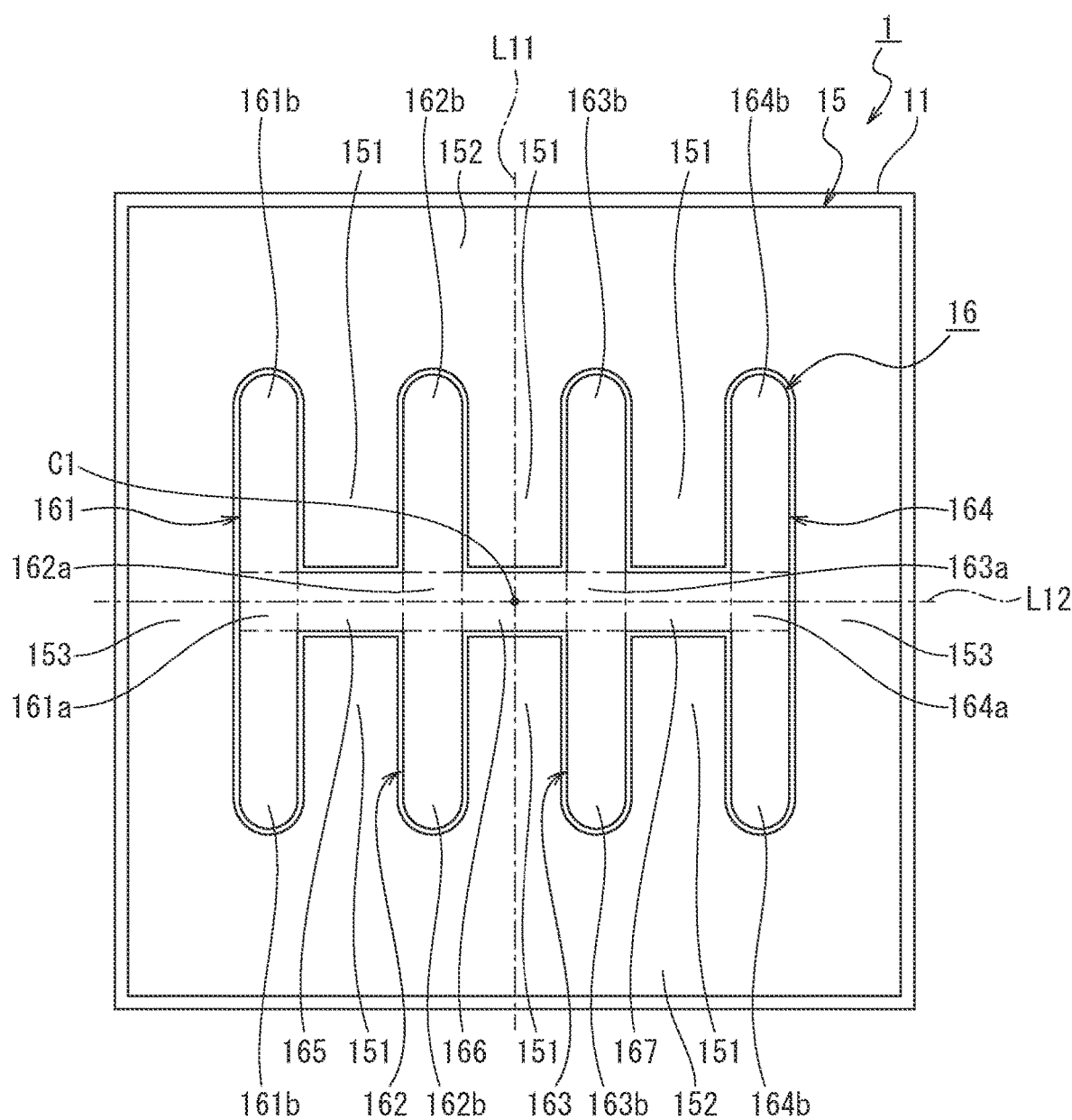
FIG. 5 is a planar view illustrating a semiconductor light emitting device included in the semiconductor light emitting apparatus according to the embodiment.

As illustrated in FIG. 5, the semiconductor chip 1 has a rectangular planer shape. Note that the planer shape of the semiconductor chip 1 is not limited to a rectangular in the narrow sense of the word, i.e., to a rectangular having a different length and width but may be a rectangular with four equal sides (i.e., a square). The semiconductor chip 1 may be of a polygonal shape such as a triangular or hexagonal shape or may have a structure including a curved part, such as a round part. The n-type electrode 15 and the p-type electrode 16 are each formed line symmetrically about both the straight line L11 and the straight line L12 in planar view, wherein L11 runs through the center C1 of the rectangle outlining the semiconductor chip 1 and is parallel to a side of the rectangle and wherein L12 runs through the center C1 and is perpendicular to the straight line L11.

In planar view, the p-type electrode 16 has four belt-like portions 161, 162, 163, 164 disposed in parallel, their longitudinal direction being along the straight line L11, and three joint portions 165, 166, 167 joining the adjacent pairs of the belt-like portions 161 to 164. The joint portion 165 joins the longitudinally central portion 161a of the belt-like portion 161 with the longitudinally central portion 162a of the belt-like portion 162, which is adjacent to the belt-like portion 161. The joint portion 166 joins the longitudinally central portion 162a of the belt-like portion 162 with the longitudinally central portion 163a of the belt-like portion 163, which is adjacent to the belt-like portion 162. The joint portion 167 joins the longitudinally central portion 163a of the belt-like portion 163 with the longitudinally central portion 164a of the belt-like portion 164, which is adjacent to the belt-like portion 163.

The longitudinal end portions 161b to 164b of the belt-like portions 161 to 164 are semicircular convex portions. The joint portions 165 to 167 are rectangles of which the short sides are lines parallel to the straight line L11 and define the boundaries with the belt-like portions 161 to 164 and the long sides are two lines parallel to the straight line L12.

In planar view, the n-type electrode 15 has six belt-like portions 151, each surrounded by belt-like portions that are adjacent to each other of the p-type electrode 16 and by a joint portion joining the belt-like portions (for example, surrounded by the belt-like portion 161, the belt-like portion 162, and the joint portion 165), longitudinally peripheral portions (the portions on either side outward of the longitudinal end portions of the belt-like portions 161 to 164, or the upper and lower end portions in FIG. 5) 152, and peripheral portions in the width direction 153 (in FIG. 5, the portion on the left of the belt-like portion 161 and the portion on the right of the belt-like portion 164).

The inner contour of the n-type electrode 15 in planar view runs along the outer contour of the p-type electrode 16 with a certain gap between them. In other words, the semiconductor chip 1 includes an n-type electrode 15 and a p-type electrode 16 that are formed adjacently in planar view.

Figure 6:
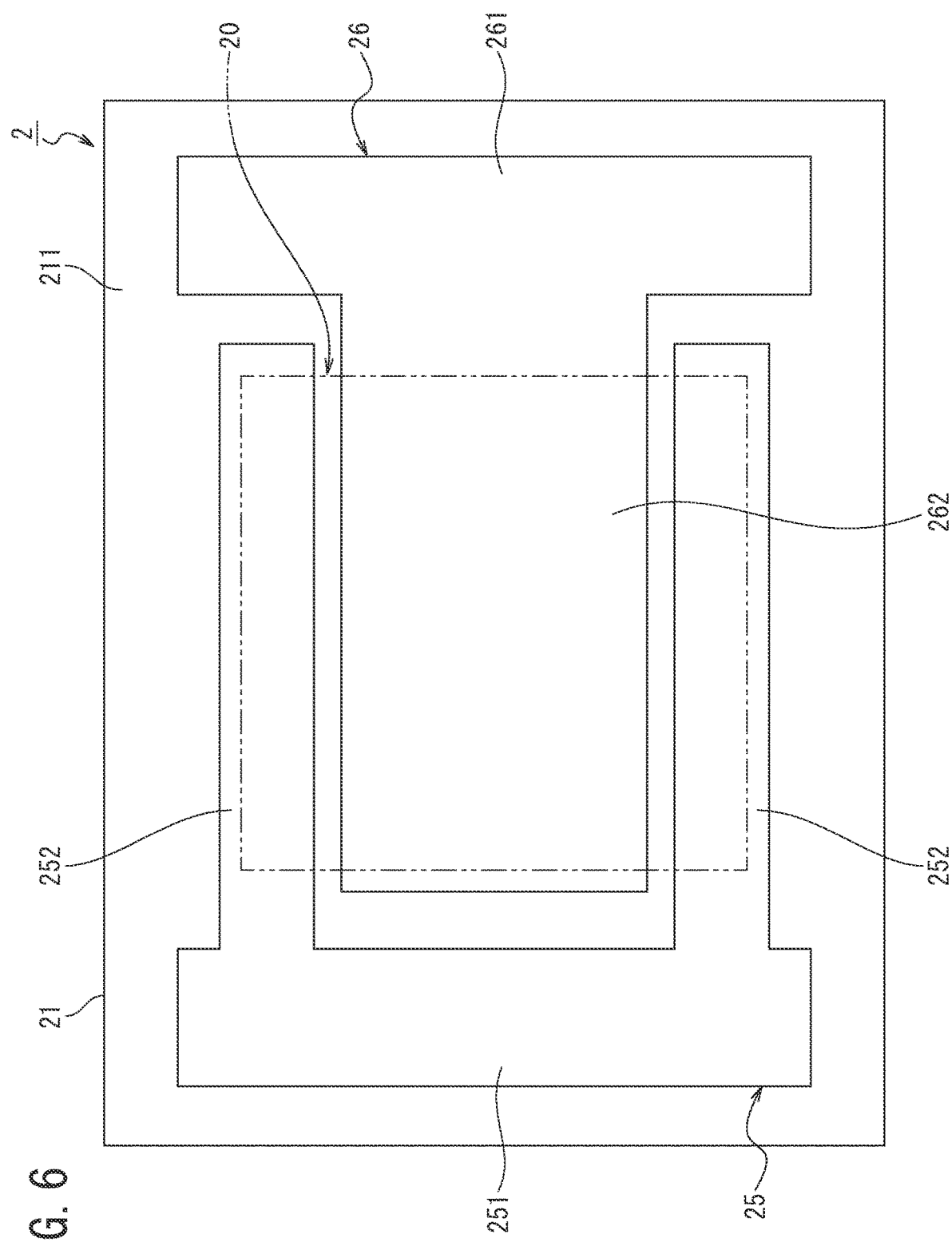
FIG. 6 is a planar view illustrating a base included in the semiconductor light emitting apparatus according to the embodiment.

As illustrated in FIGS. 4 and 6, the package substrate 2 includes an opposite surface 211 facing a surface 110 of the substrate 11 of the semiconductor chip 1.

As illustrated in FIG. 6, the package substrate 2 includes an insulating substrate 21 and an n-type electrode (third electrode) 25 and a p-type electrode (fourth electrode) 26, both formed on the opposite surface 211 of the insulating substrate 21. The n-type electrode 25 has a belt-like base portion 251 disposed on one end portion (the left end portion in FIG. 6) in the width direction (the horizontal direction in FIG. 6) of the package substrate 2 and two belt-like connecting portions 252 extending perpendicularly from both longitudinal ends (ends in vertical direction in FIG. 6) of the base portion 251.

The p-type electrode 26 has a belt-like base portion 261 disposed on the other end portion (the right end portion in FIG. 6) in the width direction (the horizontal direction in FIG. 6) of the package substrate 2 and one belt-like connecting portion 262 extending perpendicularly from the longitudinally central portion (the central portion in vertical direction in FIG. 6) of the base portion 261. The connecting portion 262 of the p-type electrode 26 is disposed between the two connecting portions 252 of the n-type electrode 25 with a gap.

The semiconductor chip 1 is disposed in a central portion 20 of the package substrate 2, the central portion 20 being rectangular in planar view. The connecting portion 252 of the n-type electrode 25 and the connecting portion 262 of the p-type electrode 26 are formed in an area covering the central portion 20.

As illustrated in FIG. 3, the two connecting portions 252 of the n-type electrode 25 of the package substrate 2 are disposed to cover the longitudinally peripheral portions 152 of the n-type electrode 15 of the semiconductor chip 1. The connecting portion 262 of the p-type electrode 26 of the package substrate 2 is disposed to cover the entire p-type electrode 16.

As illustrated in FIG. 4, the longitudinally peripheral portions 152 of the n-type electrode 15 of the semiconductor chip 1 are electrically connected with the connecting portions 252 of the n-type electrode 25 of the package substrate 2 by the first metal bumps (first connecting bodies) 3. The p-type electrode 16 of the semiconductor chip 1 is electrically connected with the connecting portion 262 of the p-type electrode 26 of the package substrate 2 by the second metal bumps (second connecting bodies) 4.

In summary, the semiconductor chip 1 is flip-chip mounted on the package substrate 2 by using the first metal bumps 3 and the second metal bumps 4. The first metal bumps 3 and the second metal bumps 4 are, for example, bumps formed of gold or gold-containing alloy and preferably are gold bumps, which have high conductivity.

As illustrated in FIG. 4, the distance between the n-type electrode 15 of the semiconductor chip 1 and the n-type electrode 25 of the package substrate 2 (the distance in the thickness direction of the semiconductor light emitting apparatus 10) is greater than that between the p-type electrode 16 of the semiconductor chip 1 and the p-type electrode 26 of the package substrate 2. The second metal bumps 4 are formed to be smaller than the first metal bumps 3 in size in the thickness direction (distance between the inner surfaces of the package substrate 2 and the semiconductor chip 1) of the semiconductor light emitting apparatus 10 to give the semiconductor light emitting apparatus 10 an even thickness.

<Disposition of Metal Bumps in Planar View>

Figure 7:
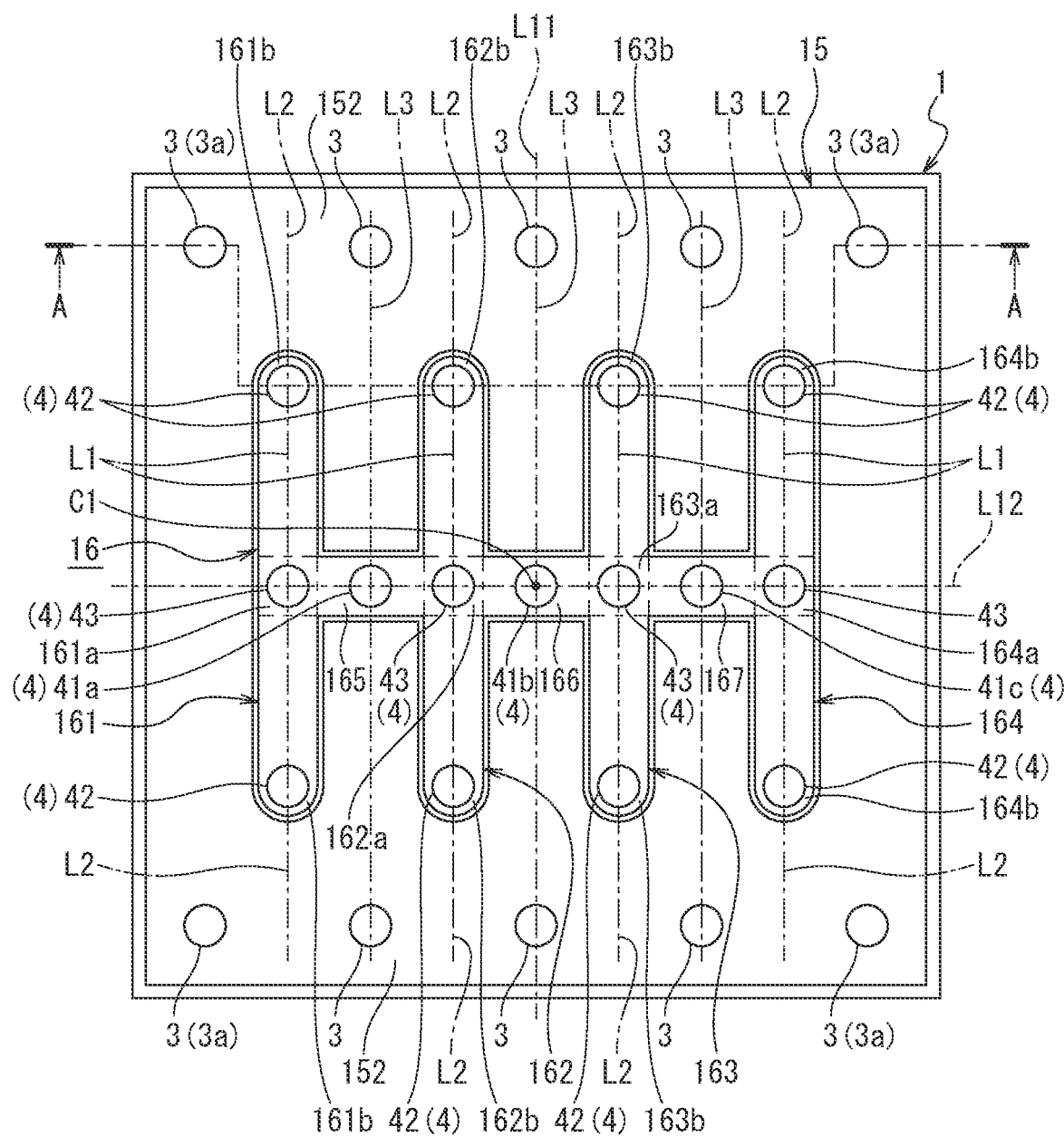
FIG. 7 is a planar view illustrating the relations between the electrodes of the semiconductor light emitting device and metal bumps, the section along line A-A is illustrated in FIG. 4.

As illustrated in FIG. 7, the semiconductor light emitting apparatus 10 according to the present embodiment includes ten first metal bumps (first connecting bodies) 3. The ten first metal bumps 3 are disposed on the longitudinally peripheral portions 152 of the n-type electrode 15, each longitudinally peripheral portion 152 allocated five of the ten bumps. Each pair of two (an even number) first metal bumps 3 adjacent to each other in the horizontal direction in FIG. 7 is disposed line symmetrically about one the extended lines L2 of the centerlines L1 respectively bisecting the widths of the belt-like portions 161 to 164 of the p-type electrode 16. Further, each of the first metal bumps 3 except the first metal bumps 3a disposed on both outermost positions in the horizontal direction in FIG. 7 is disposed between the extended lines L2 of the centerlines L1 respectively bisecting the widths of an adjacent pair of the belt-like portions 161 to 164 (on one of the centerlines L3 respectively bisecting the widths of the joint portions 165 to 167).

As illustrated in FIG. 7, the semiconductor light emitting apparatus 10 according to the present embodiment includes 15 second metal bumps (second connecting bodies) 4. Three of the 15 second metal bumps 4 are connecting bodies 41a to 41c disposed on the central portions of the joint portions 165 to 167 and eight are connecting bodies 42 disposed on the central positions in the width direction of the longitudinal end portions 161b to 164b of the belt-like portions 161 to 164. The other four are connecting bodies 43 disposed on the central portions of the longitudinally central portions 161a to 164a of the belt-like portions 161 to 164.

The straight line L3 connecting the center of the connecting body 41a disposed on the joint portion 165, which joins the belt-like portion 161 with the belt-like portion 162, with the center of the first metal bump 3 disposed most closely to the connecting body 41a on the joint portion (the centerline bisecting the width of the joint portion 165) is parallel to the centerlines L1 respectively bisecting the widths of the belt-like portion 161 and the belt-like portion 162. The straight line L3 connecting the center of the connecting body 41b disposed on the joint portion 166, which joins the belt-like portion 162 with the belt-like portion 163, with the center of the first metal bump 3 disposed most closely to the connecting body 41b on the joint portion (the centerline bisecting the width of the joint portion 166) is parallel to the centerlines L1 respectively bisecting the widths of the belt-like portion 162 and the belt-like portion 163.

The straight line L3 connecting the center of the connecting body 41c disposed on the joint portion 167, which connects the belt-like portion 163 with the belt-like portion 164, with the center of the first metal bump 3 disposed most closely to the connecting body 41c on the joint portion (the centerline bisecting the width of the joint portion 167) is parallel to the centerlines L1 respectively bisecting the widths of the belt-like portion 163 and the belt-like portion 164.

Further, the first metal bumps 3 are disposed line symmetrically about both the straight line L11 and the straight line L12 and the second metal bumps 4 are disposed line symmetrically about both the straight line L11 and the straight line L12 in planar view, the straight line L11 running through the center C1 of the planer shape of the semiconductor chip 1 and the L12 being perpendicular to the straight line L11.

<Functions and Advantageous Effects of the Present Embodiment>

The semiconductor light emitting apparatus 10 according to the present embodiment evens out the current and heat diffusion owing to the first metal bumps 3 and the second metal bumps 4, disposed as illustrated in FIG. 7, connecting the semiconductor chip 1 and the package substrate 2. Accordingly, the semiconductor light emitting apparatus 10 according to the present embodiment has an improved luminous efficacy by evening out the amount of light emitted from the light emitting surface and has a prolonged life by reducing heat diffusion variations.

As described above, the distance between the n-type electrode 15 of the semiconductor chip 1 and the n-type electrode 25 of the package substrate 2 is greater than that between the p-type electrode 16 of the semiconductor chip 1 and the p-type electrode 26 of the package substrate 2. Therefore, if the first metal bumps 3 and the second metal bumps 4 are disposed inappropriately, the impact resistance against rotational force will be insufficient when an external force is applied to the semiconductor chip 1. However, the semiconductor light emitting apparatus 10 according to the present embodiment has an excellent impact resistance to a rotational force when an external force is applied to the semiconductor chip 1, owing to the first metal bumps 3 and the second metal bumps 4 disposed as illustrated in FIG. 7.

Further, since the semiconductor light emitting apparatus 10 according to the embodiment has first metal bumps 3a disposed on the four corners of the semiconductor chip 1, the semiconductor chip 1 is curtailed from being fixed out of alignment or obliquely to the package substrate 2 even with an impact applied when the semiconductor chip 1 is being connected to the package substrate 2 or mounted on a module.

Further, the semiconductor light emitting apparatus 10 according to the embodiment reduces thermal resistance not by increasing the device size but by disposing the first metal bumps 3 and the second metal bums 4 in a large number. Therefore, the improvement of the product life can be achieved without decreasing the productivity.

Further, since the semiconductor light emitting apparatus 10 according to the embodiment has the first metal bumps 3 disposed only on the longitudinally peripheral portions 152 of the n-type electrode 15, the planar shapes of the n-type electrode 25 and the p-type electrode 26 of the package substrate 2 can be simplified as illustrated in FIG. 6. In contrast, a semiconductor light emitting apparatus with first metal bumps (first connecting bodies) 3 disposed between the adjacent pairs of the belt-like portions 161 to 164 would have complicated planer shapes for the n-type electrode and the p-type electrode of the package substrate.

In other words, a greater flexibility in designing the semiconductor light emitting apparatus is achieved by disposing the first connecting bodies line symmetrically about the extended lines L2 of the centerlines L1 respectively bisecting the widths of a plurality of second electrodes or about the extended lines L2 of the centerlines L1 respectively bisecting the widths of the plurality of belt-like portions constituting a second electrode or by disposing the first connecting bodies between the extended lines L2.

The first electrode is an n-type electrode and the second electrode is a p-type electrode in the above-described embodiment, but the first electrode may be a p-type electrode with the second electrode being an n-type electrode.

<The Case of Ultraviolet light Emitting Device>

Generally, nitride semiconductor is used as a material for producing a semiconductor light emitting device configured to emit light in the ultraviolet region. AlGaN or AlN with higher aluminum content is used for a shorter wavelength of the emitted light. When used for a semiconductor light emitting device, these materials have a greater parasitic resistance than GaN and InGaN, which are materials for visible light emitting devices. Therefore, the semiconductor light emitting apparatus according to the first aspect, the second aspect, the third aspect, and the fourth aspect of the present invention exhibits excellent advantageous effects when the semiconductor light emitting device is an ultraviolet light emitting device.

Further, ultraviolet light emitting devices emit a large amount of heat because they have a large parasitic resistance and they are driven at a high voltage and with a large current. Since a large current passes at a high current density, the devices often suffer from rotational impact when they have a structure in which a semiconductor chip is exposed, and the shorter the wavelength of the emitted light, the more conspicuous such a tendency is. Therefore, the semiconductor light emitting apparatus according to the first aspect, the second aspect, the third aspect, and the fourth aspect of the present invention exhibits excellent advantageous effects especially with shorter wavelengths of the emitted light of the semiconductor light emitting device.

The use of aluminum nitride as the substrate allows thin-film growth with small dislocation density and enables the production of a semiconductor chip with high luminous efficacy. Therefore, the semiconductor light emitting apparatus according to the first aspect, the second aspect, the third aspect, and the fourth aspect of the present invention exhibits excellent advantageous effects especially when the substrate is aluminum nitride substrate.

<Ultraviolet light Emitting Module>

A semiconductor light emitting apparatus and an ultraviolet light emitting module according to each aspect of the present invention can be applied, for example, to equipment in such fields as medical care and life science, environment, industry and manufacturing, household goods and domestic electric appliance, agriculture, and others. A semiconductor light emitting apparatus according to each aspect of the present invention can be applied to synthesis and decomposition equipment for pharmaceuticals and chemical substances, sterilization equipment for liquids, gases, and solids (containers, food, medical equipment, etc.), cleaning equipment for semiconductors, etc., surface modification equipment of films, glass, metals, etc., aligners for the production of semiconductors, FPDs, PCBs, and other electronic articles, printing and coating equipment, adhesion and sealing equipment, transfer and generation equipment for films, patterns, mockups, etc., and measurement and inspection equipment for banknotes, wounds, blood, chemical substances, etc.

Examples of a use of sterilization equipment for liquids include, for example, automatic ice makers and ice-cube trays in refrigerators and water supply tanks for ice storage containers or ice machines, freezers, ice machines, humidifiers, dehumidifiers, cold water tanks, hot water tanks, and fluid pipes for water servers, stationary water purifiers, portable water purifiers, water dispensers, hot water dispensers, waste water treatment equipment, disposers, drain traps of toilets, washing machines, sterilizing modules for dialyzing fluid, sterilizers for connectors for peritoneal dialysis, emergency water storage systems, and the like but are not limited to these.

Examples of a use of sterilization equipment for gases include, for example, air purifiers, air conditioners, ceiling fans, cleaners for floor or bedding, futon dryers, shoe dryers, washing machines, clothes dryers, indoor germicidal lamps, warehouse ventilation systems, shoe boxes, chests of drawers, and the like but are not limited to these. Examples of a use of sterilization equipment (including surface sterilization equipment) for solids include, for example, vacuum sealers, belt conveyors, sterilization equipment for hand tools for doctors, dentists, barbers, and hairdressers, toothbrushes, toothbrush holders, chopstick cases, toiletry pouches, drain lids, bidet-toilets, toilet lids, and the like but are not limited to these.

REFERENCE SIGNS LIST 10 semiconductor light emitting apparatus
1 semiconductor chip (semiconductor light emitting device)
11 substrate
110 a surface of the substrate
12 n-type nitride semiconductor layer
13 nitride semiconductor active layer
14 p-type nitride semiconductor layer
15 n-type electrode of the semiconductor chip (first electrode)
16 p-type electrode of the semiconductor chip (second electrode)
161, 162, 163, 164 belt-like portion (belt-like portion forming the second electrode)
165, 166, 167 joint portion
161a, 162a, 163a, 164a longitudinally central portion of a belt-like portion
161b, 162b, 163b, 164b longitudinal end portion of a belt-like portion
2 package substrate (base)
211 opposite surface (surface facing a surface of the substrate)
25 n-type electrode of the package substrate (third electrode)
252 connecting portion of the n-type electrode of the package substrate
26 p-type electrode of the package substrate (fourth electrode)
262 connecting portion of the p-type electrode of the package substrate
3 first metal bump (first connecting body)
4 second metal bump (second connecting body)
41a to 41c connecting body disposed on a joint portion
42 connecting body disposed on a longitudinal end portion of a belt-like portion
43 connecting body disposed on the longitudinally central portion of the belt-like portion
101 belt-like portion of the second electrode
102 first connecting body
102A first connecting body
103 joint portion of the second electrode
201 connecting body disposed on a joint portion
202 connecting body disposed on a longitudinal end portion of a belt-like portion
L1 centerline bisecting the width of a belt-like portion
L2 extended line of the centerline bisecting the width of a belt-like portion
L3 centerline bisecting the width of a joint portion (straight line connecting the center of the connecting body disposed on the joint portion with the center of the first connecting body disposed most closely to the connecting body disposed on the joint portion)

The invention claimed is:

1. A semiconductor light emitting apparatus, comprising:
a semiconductor light emitting device formed on a surface of a substrate including a first electrode and a second electrode formed adjacent to the first electrode in planar view;
a base including an opposite surface facing the surface of the substrate, wherein a third electrode corresponding to the first electrode in positional relationship and a fourth electrode corresponding to the second electrode in positional relationship are formed on the opposite surface;
first connecting bodies electrically connecting the first electrode with the third electrode; and
a second connecting body electrically connecting the second electrode with the fourth electrode,
wherein the second electrode has a plurality of belt-like portions,
wherein centerlines respectively bisecting widths of the plurality of belt-like portions are substantially parallel in planar view, and
wherein, for every belt-like portion of the second electrode, an even number of the first connecting bodies are disposed substantially line symmetrically about the extended line of the centerline bisecting the width of the belt-like portion in planar view.

2. The semiconductor light emitting apparatus according to claim 1, wherein the even number of the first connecting bodies are disposed substantially line symmetrically about the each of extended lines on each side longitudinally outward of the belt-like portions in planar view.

3. The semiconductor light emitting apparatus according to claim 1,
wherein at least one of the first connecting bodies is disposed between extended lines of centerlines respectively bisecting widths of an adjacent pair of the belt-like portions in planar view.

4. The semiconductor light emitting apparatus according to claim 3,
wherein the second electrode has a shape in planar view in which the plurality of belt-like portions have longitudinally central portions and each adjacent pair of the longitudinally central portions is joined by a joint portion.

5. The semiconductor light emitting apparatus according to claim 4, comprising a connecting body disposed on the joint portion and a connecting body disposed on a longitudinal end portion of one of the belt-like portions, the connecting bodies serving as the second connecting body.

6. The semiconductor light emitting apparatus according to claim 4, wherein the substrate is an aluminum nitride substrate.

7. The semiconductor light emitting apparatus according to claim 1,
wherein the second electrode has a shape in planar view in which the plurality of belt-like portions have longitudinally central portions and each adjacent pair of the longitudinally central portions is joined by a joint portion.

8. The semiconductor light emitting apparatus according to claim 7, wherein the even number of the first connecting bodies are disposed substantially line symmetrically about the each of extended lines on each side longitudinally outward of the belt-like portions in planar view.

9. The semiconductor light emitting apparatus according to claim 8, comprising a connecting body disposed on the joint portion and a connecting body disposed on a longitudinal end portion of one of the belt-like portions, the connecting bodies serving as the second connecting body.

10. The semiconductor light emitting apparatus according to claim 7, comprising a connecting body disposed on the joint portion and a connecting body disposed on a longitudinal end portion of one of the belt-like portions, the connecting bodies serving as the second connecting body.

11. The semiconductor light emitting apparatus according to claim 10, wherein a straight line connecting the center of the connecting body disposed on the joint portion with the center of the first connecting body disposed most closely to the connecting body disposed on the joint portion is substantially parallel to the centerlines respectively bisecting the widths of the belt-like portions in planar view.

12. The semiconductor light emitting apparatus according to claim 1, wherein the second connecting body and the first connecting body or bodies are metal bumps.

13. The semiconductor light emitting apparatus according to claim 1, wherein the substrate is an aluminum nitride substrate.

14. The semiconductor light emitting apparatus according to claim 1, wherein the semiconductor light emitting device is an ultraviolet light emitting device configured to emit ultraviolet light having an wavelength of not more than 360 nm.

15. An ultraviolet light emitting module comprising the semiconductor light emitting apparatus according to claim 14.

16. A semiconductor light emitting apparatus according to claim 1, wherein a distance from each of the even number of the first connecting bodies to the extended line of the centerlines are the same.

17. A semiconductor light emitting apparatus according to claim 1, wherein a length of every belt-like portion of the second electrode is substantially the same as a length of every other belt-like portion of the second electrode.

18. A semiconductor light emitting device apparatus to claim 1, wherein:
   the apparatus comprises a plurality of second connecting bodies electrically connecting the second electrode with the fourth electrode; and
   a total number of the second connecting bodies is more than a total number of the first connecting bodies.

19. A semiconductor light emitting apparatus according to claim 1, wherein:
   the apparatus comprises a plurality of second connecting bodies electrically connecting the second electrode with the fourth electrode; and
   at least some of the second connecting bodies are arranged in a linear arrangement parallel to an imaginary line connecting the nearest first connecting bodies.

20. A semiconductor light emitting apparatus according to claim 1, wherein:
   the apparatus comprises a plurality of second connecting bodies electrically connecting the second electrode with the fourth electrode; and
   at least some of the second connecting bodies are arranged in a linear arrangement at right angle to an imaginary line connecting the nearest first connecting bodies.

* * * * *